United States Patent [19]

Sadjadian et al.

[11] Patent Number: 5,432,511
[45] Date of Patent: Jul. 11, 1995

[54] SAMPLING FREQUENCY CONVERSION USING INTERRUPT CONTROL

[75] Inventors: Ahmed Sadjadian, Swindon; Terence R. Hurley, Newbury; Simon M. Manze, Guildford, all of United Kingdom

[73] Assignee: Sony United Kingdom, Ltd., Staines, United Kingdom

[21] Appl. No.: 59,371

[22] Filed: May 12, 1993

[30] Foreign Application Priority Data

May 21, 1992 [GB] United Kingdom ............ 9210860

[51] Int. Cl.⁶ ............................................. H03M 7/00
[52] U.S. Cl. ................................... 341/61; 364/724.1
[58] Field of Search ............. 341/61; 364/723, 724.10

[56] References Cited

U.S. PATENT DOCUMENTS

| | | | |
|---|---|---|---|
| 4,460,890 | 7/1984 | Busby | 341/61 |
| 4,639,920 | 1/1987 | Kaneko | 364/723 |
| 4,748,578 | 5/1988 | Lagadec et al. | 364/724 |
| 5,038,365 | 8/1991 | Belloc et al. | 341/61 |
| 5,126,737 | 6/1992 | Torii | 341/61 |
| 5,285,401 | 2/1994 | Pelloni | 364/721.10 |

FOREIGN PATENT DOCUMENTS

0227172 7/1987 European Pat. Off. .
0262647 4/1988 European Pat. Off. .

Primary Examiner—Howard L. Williams
Attorney, Agent, or Firm—William S. Frommer; Alvin Sinderbrand

[57] ABSTRACT

A sampling frequency converter having an oversampler for operating on input data supplied to the converter, a signal processor for controlling operation of the sampling frequency converter and for generating oversampled output data from the oversampled input data, and a downsampler for generating output data at the output sampling frequency from the oversampled output data. The input and output of data by the signal processor are controlled by respective input and output interrupt signals, the output interrupt signal having a lower interrupt priority than the input interrupt signal.

8 Claims, 9 Drawing Sheets

SAMPLING FREQUENCY CONVERSION USING INTERRUPT CONTROL

BACKGROUND OF THE INVENTION

1. Field of the Invention

This invention relates to sampling frequency conversion.

2. Description of the Prior Art

It is known to use sampling frequency converters in applications such as conversion between sampling frequencies associated with different pulse code modulation (PCM) audio signal transmission systems. Sampling frequency conversion is particularly useful in a digital audio recording or editing studio in order to provide an interface between items of digital audio equipment operating at different sampling frequencies, without having to convert to and from an intermediate analogue signal. Although items of equipment operating at the same nominal sampling frequency can generally be synchronised with a 'master' clocking signal distributed from a single source to those items, there still remains a need for sampling frequency conversion in that several different sampling frequency standards are used in current digital audio equipment (e.g. 32 kHz, 44.056 kHz, 44.1 kHz, 48 kHz).

A sampling frequency converter disclosed in EP-A-0 323 200 employs a stage of oversampling the input data samples by an integral oversampling factor before sampling frequency conversion, and a stage of downsampling by an integral downsampling factor after sampling frequency conversion.

SUMMARY OF THE INVENTION

It is an object of the invention to provide an improved sampling frequency conversion method and apparatus.

This invention provides a sampling frequency converter for converting sampled input data having an input sampling frequency into sampled output data having a selected output sampling frequency, said converter comprising:

(i) means for oversampling said input data to generate oversampled input data having a sampling frequency greater than said input sampling frequency;

(ii) a signal processor for controlling operation of said sampling frequency converter and for generating oversampled output data from said oversampled input data, said oversampled output data having a sampling frequency greater than said output sampling frequency;

(iii) means for generating a first interrupt signal, at said sampling frequency of said oversampled input data, to control reading of said oversampled input data by said signal processor;

(iv) means for generating a second interrupt signal, at said sampling frequency of said oversampled output data, to control output of said oversampled output data by said signal processor, wherein said second interrupt signal has a lower interrupt priority than said first interrupt signal so that said first interrupt signal is processed by said signal processor in preference to said second interrupt signal; and (v) means for downsampling said oversampled output data to generate output data at said output sampling frequency.

In a sampling frequency converter according to the invention the major signal processing functions, along with the control of the sampling frequency converter, are performed by a single signal processor.

It is preferred that the signal processor comprises: an oversampler for operating on the oversampled input data to generate intermediate oversampled data; and means for subsampling the intermediate oversampled data to generate the oversampled output data.

In a preferred embodiment the sampling frequency converter comprises means for generating each sample in the oversampled output data from a sample in the intermediate oversampled data which is temporally closest to that sample in the oversampled output data. In particular, it is preferred that each sample in the oversampled output data is equal to the sample in the intermediate oversampled data which is temporally closest to that sample in the oversampled output data.

Although the sampling frequency of the oversampled output data could be greater than the sampling frequency of the oversampled input data, a reduction in alias distortion is obtained if the sampling frequency of the oversampled output data is lower than the sampling frequency of the oversampled input data.

Viewed from a second aspect this invention provides a method of converting sampled input data having an input sampling frequency into sampled output data having a selected output sampling frequency, said method comprising the steps of:

(i) oversampling said input data to generate oversampled input data having a sampling frequency greater than said input sampling frequency;

(ii) generating a first interrupt signal, at said sampling frequency of said oversampled input data, to control reading of said oversampled input data by a signal processor operable to generate oversampled output data from said oversampled input data, said oversampled output data having a sampling frequency greater than said output sampling frequency;

(iii) generating a second interrupt signal, at said sampling frequency of said oversampled output data, to control output of said oversampled output data by said signal processor, wherein said second interrupt signal has a lower interrupt priority than said first interrupt signal so that said first interrupt signal is processed by said signal processor in preference to said second interrupt signal; and (iv) downsampling said oversampled output data to generate output data at said output sampling frequency.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
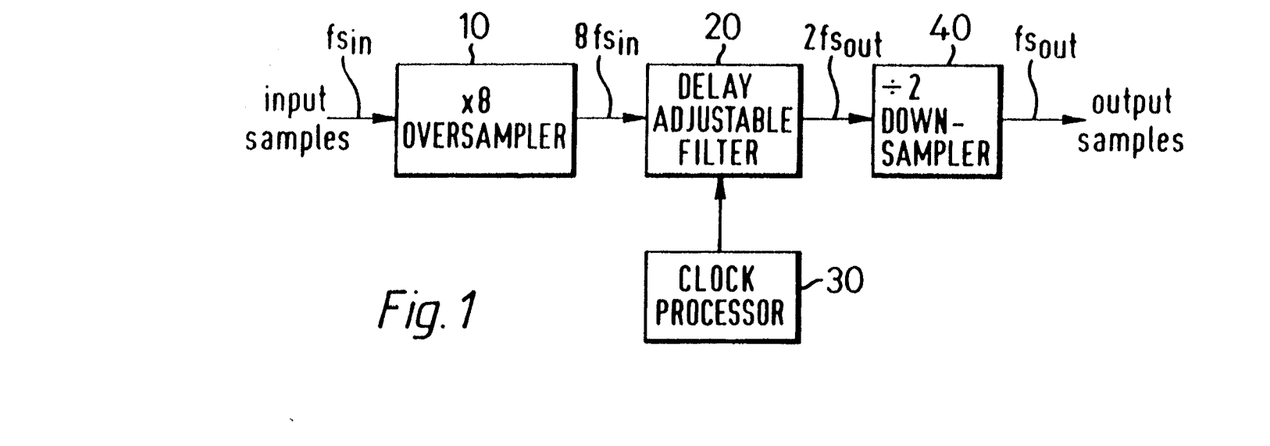
FIG. 1 is a schematic block diagram showing the function of a digital audio sample rate converter.

Referring now to FIG. 1, a schematic block diagram is shown which illustrates the function of a digital audio sampling rate converter (DASRC). An input audio signal, sampled at a sampling rate of $fs_{in}$, is passed first to an eight-times oversampler 10 which converts the input signal sampled at $fs_{in}$ into an oversampled input signal having a sampling frequency of $8fs_{in}$. The oversampled input signal is passed to a delay adjuster filter 20 which, under the control of a clock processor 30, converts the oversampled input data to oversampled output data at a sampling rate of $2fs_{out}$ (twice the desired output sampling rate). The oversampled output signal is then passed to a two-times downsampler 40 which generates an output signal sampled at an output sampling rate of $fs_{out}$.

Figure 2:
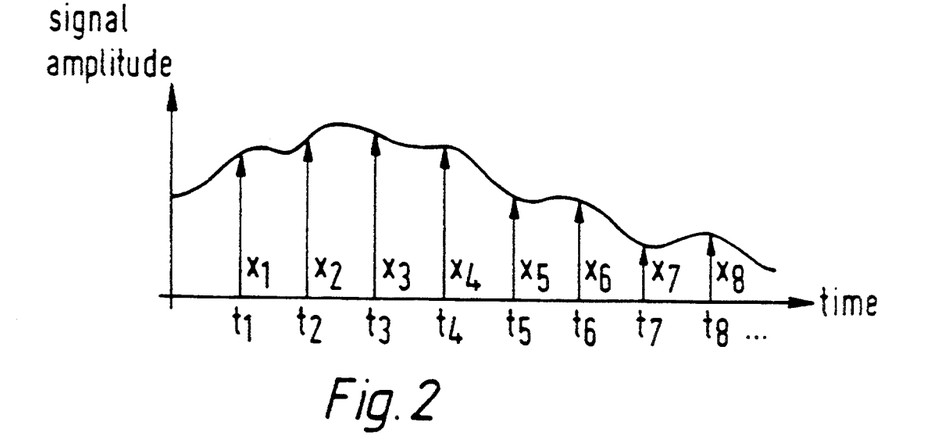
FIG. 2 illustrates a sampled analogue signal in the time domain.

FIG. 2 is an illustration in the time domain of a sampling process applied to an analogue signal. FIG. 2 is a graph showing the amplitude of the analogue signal on a vertical axis, against time on a horizontal axis. The analogue signal is sampled at a number of temporally spaced instants $t_1$, $t_2$, $t_3$ . . . to yield corresponding sample values $x_1$, $x_2$, $x_3$ . . . . The sampling frequency is the reciprocal of the time period between successive sampling instants.

Figure 3:
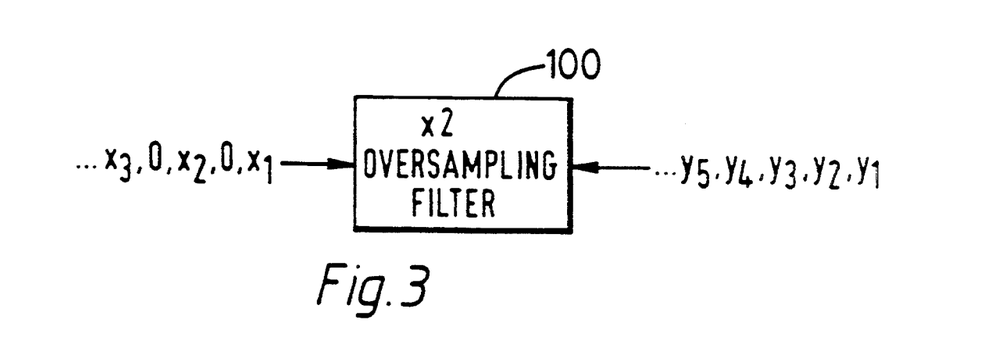
FIG. 3 is a schematic diagram showing the operation of an oversampling filter.
Figure 4:
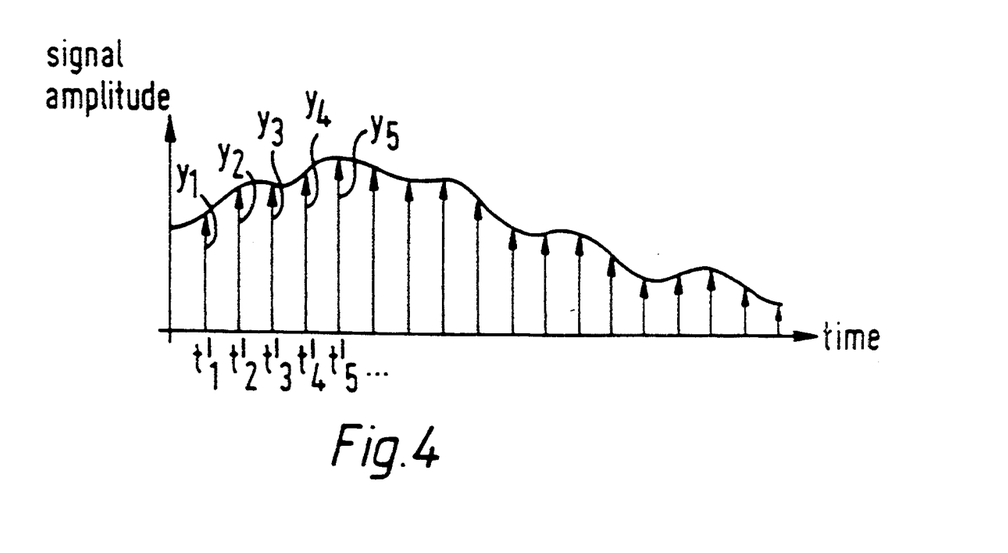
FIG. 4 illustrates an oversampled version of the sampled analogue signal of FIG. 12.

FIG. 3 is a schematic diagram showing the operation of an oversampling filter on the sampled analogue signal of FIG. 2. A two-times oversampling filter 100 is shown, which operates on successive input samples $x_n$ to generate successive output signals $y_n$ at twice the sampling frequency of the input samples. Before being processed by the oversampling filter 100 the input samples $x_n$ are interspersed with zero-valued samples in order that the number of input samples applied to the oversampling filter 100 is the same as the number of required output samples. In general, for a oversampling factor of I, (I−1) zero-valued samples must be placed between adjacent samples of the input signal. The output samples $y_n$ represent the amplitude of the analogue signal at successive instants $t_1'$, $t_2'$, $t_3'$ . . . and are shown graphically in FIG. 4 in relation to the original analogue signal.

Figure 5A:
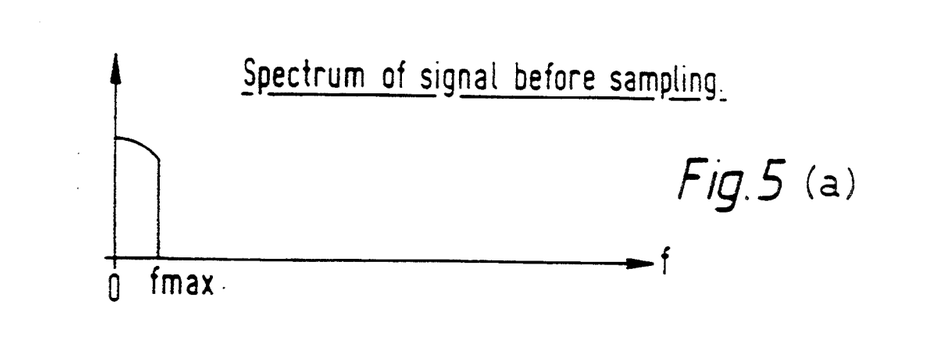
FIG. 5 is a schematic illustration showing the oversampling process in the frequency domain.

FIGS. 5(a) to 5(d) are schematic illustrations, in the frequency domain, of the oversampling process performed by the oversampling filter 100 of FIG. 3. In these illustrations, the signal amplitude is represented on a vertical axis, against signal frequency on a horizontal axis. FIG. 5(a) illustrates the frequency spectrum of an example analogue signal before sampling is performed. Before any sampling takes place, the analogue signal occupies a frequency range from 0 to fmax.

Figures 5B, 5C:
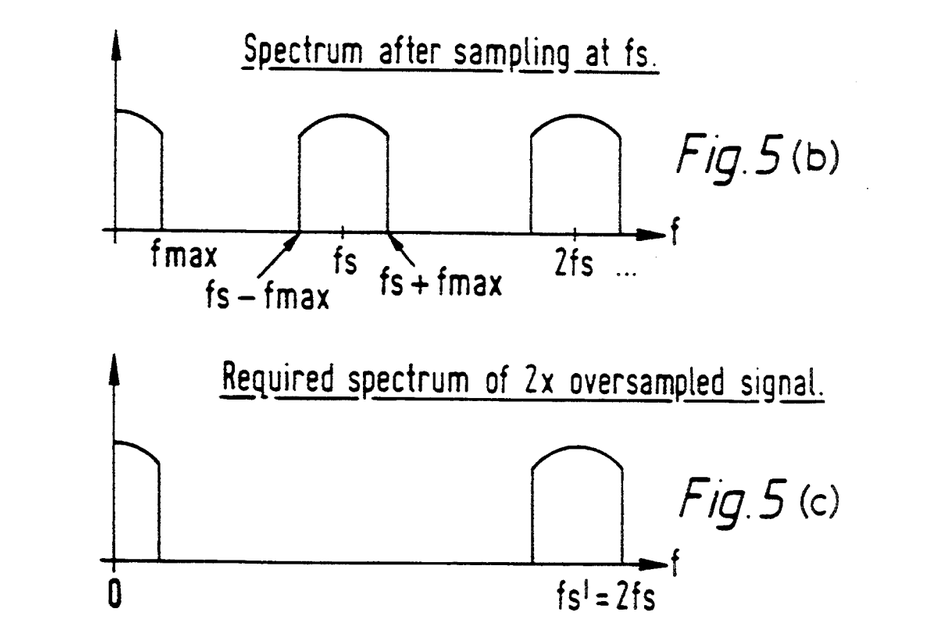

FIG. 5(b) illustrates the spectrum of a signal after a sampling process at a sampling frequency of fs has been performed. In addition to the original baseband signal (from 0 to fmax), sideband signals have been generated by the sampling process which are centred around harmonics of the sampling frequency fs. For example, a first sideband extends between the frequencies of (fs−fmax) and (fs+fmax). Similar sidebands are centred around 2fs, 3fs and so on.

FIG. 5(c) illustrates the required spectrum of the signal of FIG. 5(b) after that signal has been subjected to a two-times oversampling process. The effect of the oversampling process is to generate output samples ($y_n$ in FIG. 3) at a sampling frequency which is a multiple of the original sampling frequency of the signal. In the case of a two-times oversampling process, the sampling frequency (fs') of the output samples $y_n$ will be twice that of the original sampled signal $x_n$. (That is to say, fs'=2fs). This means that the two-times oversampled signal should have sidebands centred around fs'(=2fs), 2fs'(=4fs) and so on. A visual comparison of FIGS. 5(b) and 5(c) demonstrates that the two-times oversampling filter 100 is required to remove the sidebands centred around odd multiples of the frequency fs.

Figure 5D:
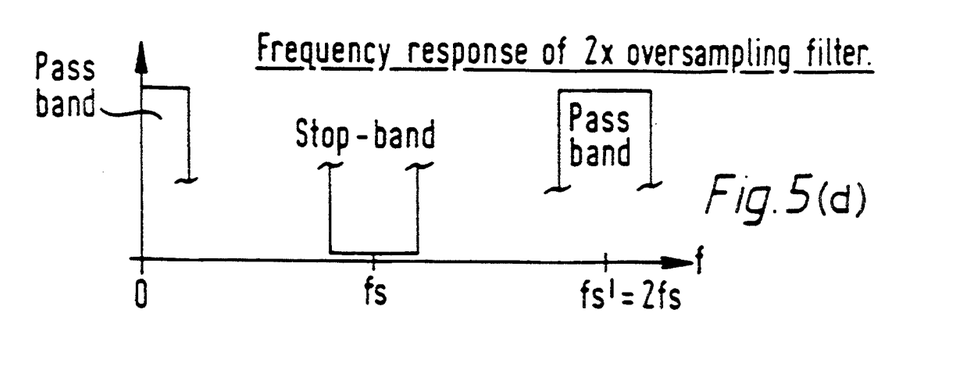

The actual frequency response of the two-times oversampling filter is illustrated in FIG. 5(d). As shown in FIG. 5(d), the two-times oversampling filter 100 requires a passband ranging from 0 to fmax, a stopband of width 2fmax centred around the frequency fs, and a further pass band of width 2fmax centred around the frequency fs' (where fs'=2fs). In general, an oversampling filter having an oversampling factor of I requires a pass band ranging from 0 to at least fmax, (I−1) stop bands having a width of at least 2fmax centred around multiples of fs from 1fs to (I−1)fs, and a further pass band having a width of at least 2fmax centred around the frequency Ifs.

Figure 6:
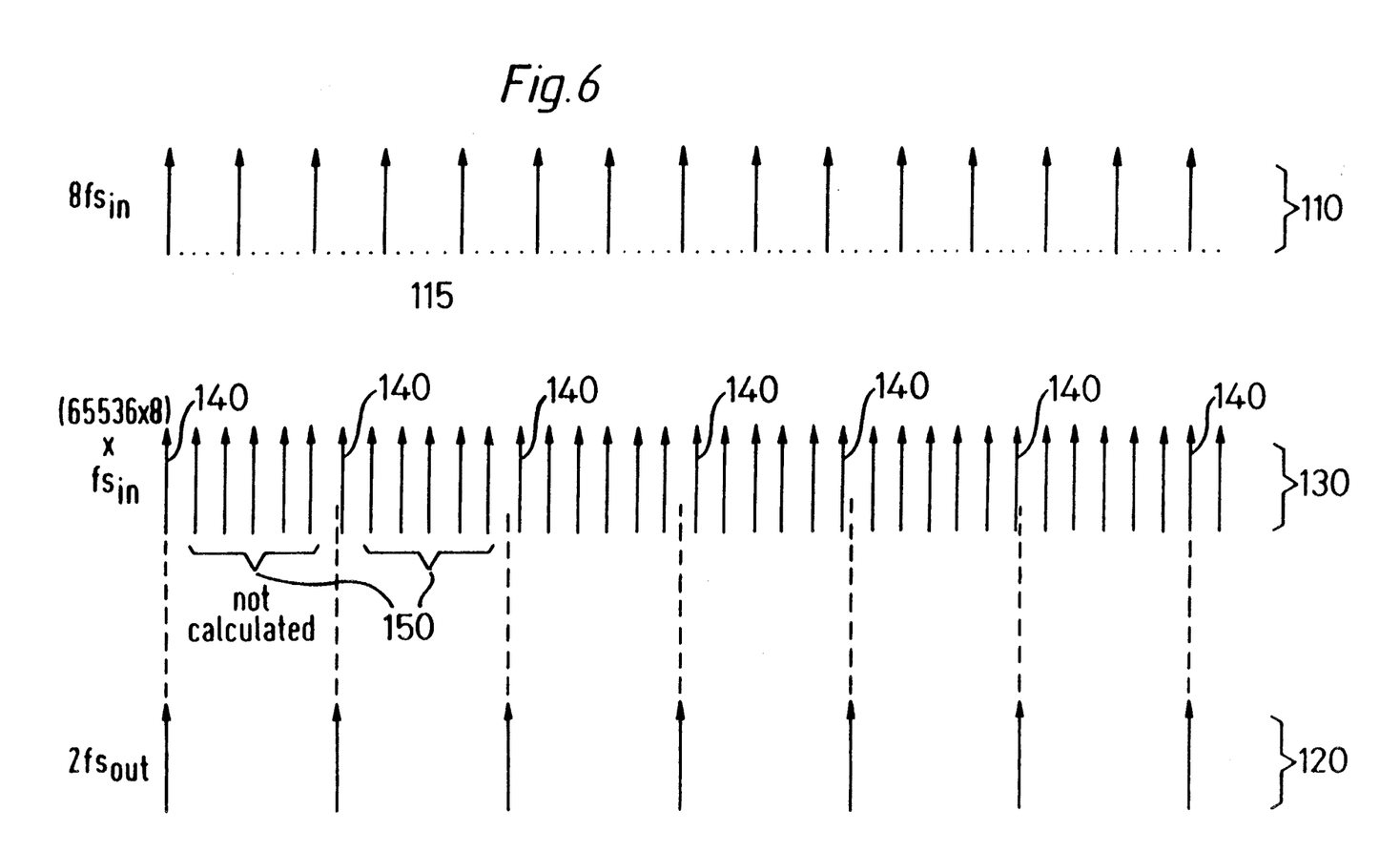
FIG. 6 illustrates the operation of a delay adjuster filter.

FIG. 6 illustrates the operation of the delay adjuster filter 20 of FIG. 1. It will be recalled that the samples supplied as an input to the delay adjuster filter 20 have a sampling frequency of $8fs_{in}$, since they have already undergone an eight-times oversampling process by the eight-times oversampler 10. Also, it will be recalled that the output samples generated by the delay adjuster filter 20 are at twice the required output sampling frequency (that is, $2fs_{out}$). In FIG. 6, the input samples at the sampling frequency $8fs_{in}$ supplied to the delay adjuster filter 20 are shown schematically at respective positions 110 along a horizontal time axis, and the output samples at the sampling frequency of $2fs_{out}$ are similarly shown at respective positions 120 along the horizontal time axis.

The delay adjuster filter 20 operates basically to oversample the input samples supplied to it by a very large oversampling factor, to generate intermediate samples 130 having a very small temporal separation. For each of the output samples 120, that one of the intermediate samples 130 having a temporal position closest to that of the output sample 120 is used as that output sample 120.

In this embodiment, the oversampling factor used in the delay adjuster filter 20 is 65536, although (for clarity of the diagram) such a large oversampling factor has not been shown in FIG. 6. In theory, in order to perform a process of 65536-times oversampling, 65535 zero-valued samples must be inserted between each of the input samples supplied to the delay adjuster filter 20. In practice, this requirement is avoided, but for the purposes of explaining FIG. 6 it will be assumed initially that zero-insertion has been performed. The zero-valued samples are shown schematically in FIG. 6 as points (e.g. the point 115) between adjacent input samples 110.

It would be possible for the delay adjuster filter 20 to calculate all 65536 intermediate samples 130 for each input sample 110, to use selected ones of the intermediate samples 130 as two-times oversampled output samples 120 and to discard the remaining vast majority of the intermediate samples 130. However, since 65535 out of every 65536 intermediate samples are discarded, a considerable saving in computation time can be achieved by calculating only the relevant one out of every 65536 intermediate samples. In practice therefore, the delay adjuster filter 20 operates in conjunction with the clock processor 30 to select, for each output sample at the sampling frequency of $2fs_{out}$, that one 140 of the 65536-times oversampled samples which is nearest to the temporal position of the required output sample. This selected oversampled sample 140 is then calculated and output as an output sample. The intervening oversampled samples 150 are not calculated.

As mentioned above, for each output sample at $2fs_{out}$, the nearest oversampled sample 140 is selected and used as that output sample 120. For some of the output samples 120, the temporal position of the selected oversampled sample 140 may not coincide exactly with the temporal position of the required output sample. This will generally be the case when the output sampling frequency $fs_{out}$ is not related by a simple ratio to the input frequency $fs_{in}$. However, neglecting any errors in the calculation of the temporal position of the output samples, the maximum error in temporal position which can occur is one half of the temporal separation of the 65536-times oversampled samples 130. In the present embodiment, for an input sampling frequency $fs_{in}$ of 48 kHz, the temporal separation of successive 65536-times oversampled samples 130 is approximately 40 picoseconds (pS) so the maximum temporal error in an output sample is approximately 20 pS.

The 65536-times oversampling filter used in the delay adjuster filter 20 has a very large number (323307) of coefficients, the derivation of which will be described below with reference to FIG. 9. In principle, when one of the samples 140 is calculated, each of these coefficients is multiplied by the value of a corresponding zero-inserted input sample 110 (assuming that zero-insertion had taken place). However, the vast majority (65535 in every 65536) of the zero-inserted input samples 110 are zero-valued samples, so although these zero-valued samples could be multiplied by corresponding coefficients, the result of the multiplication would automatically be zero. In practice therefore neither zero insertion nor the step of multiplying coefficients by zero is actually performed.

As mentioned above, the 65536-times oversampling filter used in the delay adjuster filter 20 in this embodiment has 323307 coefficients, each of which is (in theory) multiplied by a corresponding one of the zero-inserted input samples 110. However, since zero-insertion is not performed, only one in 65536 of the input samples 110 to be multiplied by corresponding coefficients will be present. This means that the number of actual multiplications which needs to be performed to generate one output sample 140 is equal to:

$$\text{integer value of} \left( \frac{323307}{65536} + 1 \right) = 5 \text{ multiplications}$$

The way in which five coefficients are selected from the 323307 possible coefficients for use in generation of each output sample will be described below with reference to FIG. 7.

Figure 7:
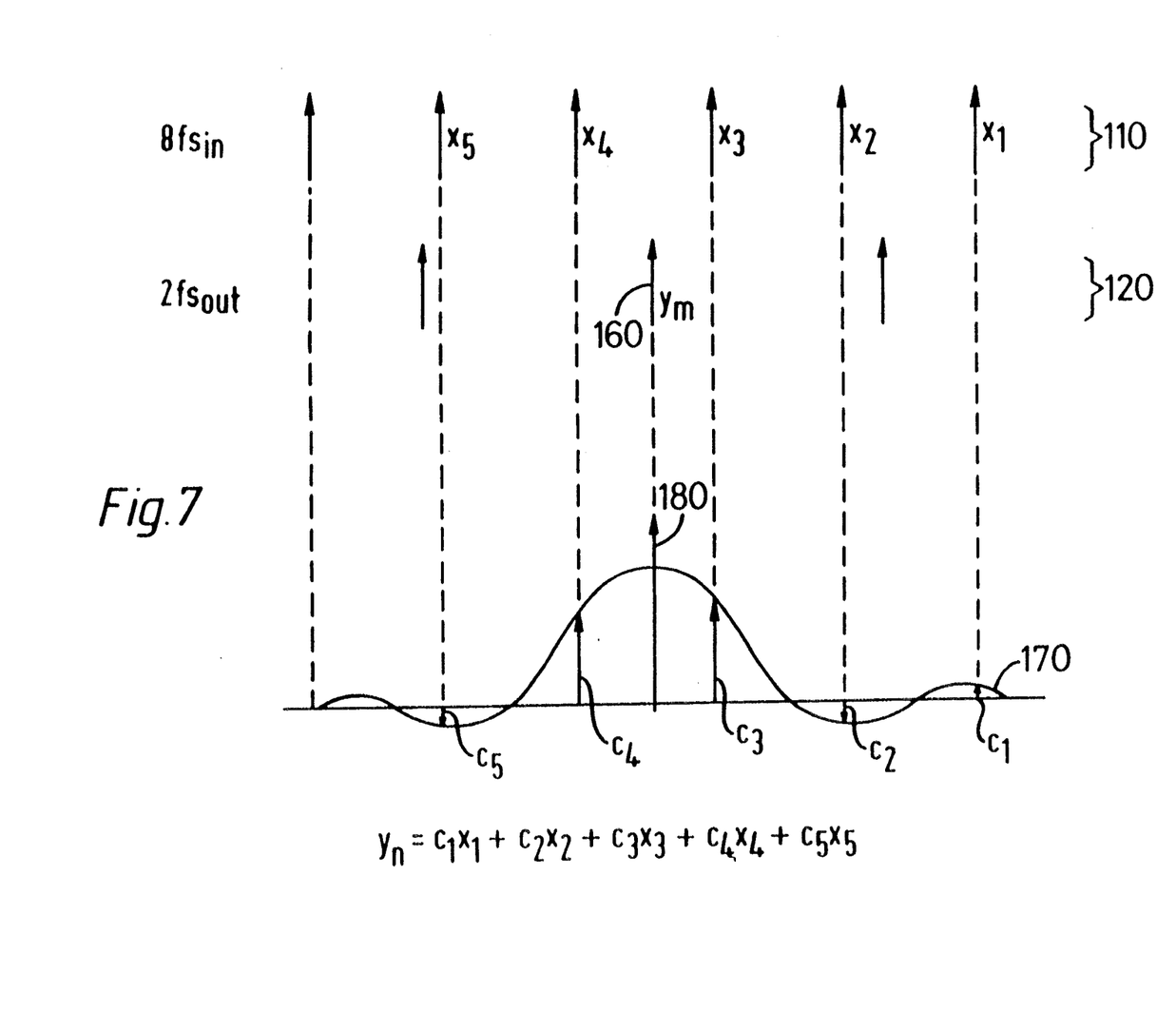
FIG. 7 illustrates the selection of filter coefficients in the delay adjuster filter of FIG. 6.

FIG. 7 is a schematic illustration showing the selection of the five filter coefficients used in the derivation of each output sample. In particular, the coefficient for use in the generation of an output sample $y_m$ 160 will be shown. In FIG. 7 the 323307 individual coefficients in the 65536-times oversampling filter used in the delay adjuster filter 20 are not shown individually, for reasons of clarity of the diagram, but instead their envelope is shown by a curve 170.

In order to derive the output sample 160, the centre coefficient 180 of the set of 323307 coefficients is aligned with the temporal position of the output sample 160 and the coefficients nearest to the temporal positions of the 5 input samples 110 surrounding that output sample 160 are selected for multiplication by the corresponding input sample. In the example shown in FIG. 7, an input sample $x_1$ is multiplied by a filter coefficient $c_1$; an input sample $x_2$ is multiplied by a filter coefficient $c_2$; and so on up to an input sample $x_5$ which is multiplied by a filter coefficient $c_5$. The output sample is then generated from the sum of the products of the above multiplications so that:

$$y_n = c_1 \cdot x_1 + c_2 \cdot x_2 + c_3 \cdot x_3 + c_4 \cdot x_4 + c_5 \cdot x_5 = \sum_{i=1}^{i=5} c_i \cdot x_i$$

Figure 8:
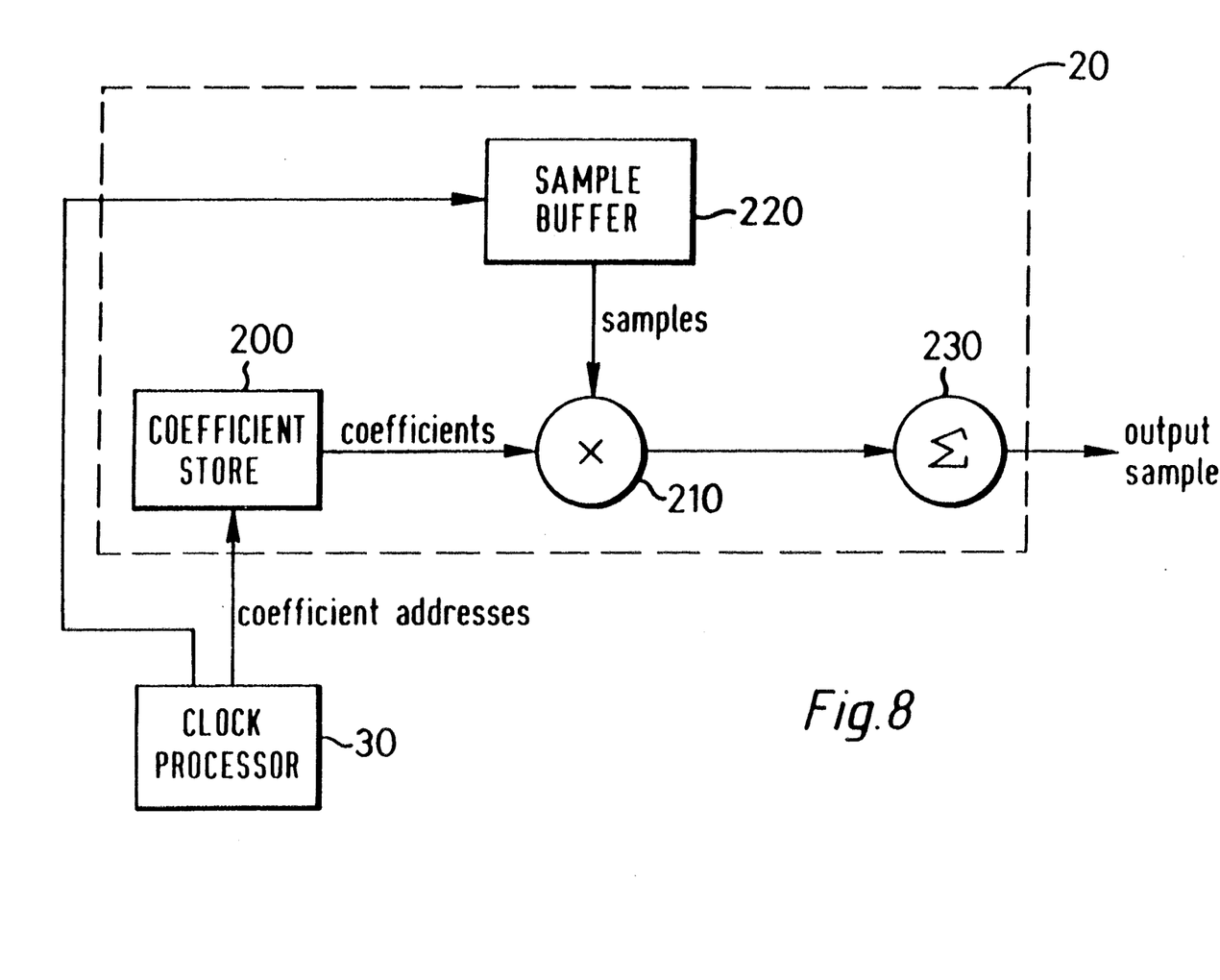
FIG. 8 is a schematic block diagram of the delay adjuster filter of FIG. 6.

FIG. 8 is a schematic block diagram showing the delay adjuster filter 20 and its relationship to the clock processor 30.

The clock processor 30 is responsive to the temporal positions of the input samples (supplied to the delay adjuster filter 20) and of the output samples (to be generated by the delay adjuster filter 20) in order to generate coefficient addresses for accessing the appropriate coefficients in a coefficient store 200 in the manner described above with reference to FIG. 7. The coefficient store 200 may be implemented as a programmable read only memory to store numerical representations of the coefficients. (Because the filter coefficients in the 65536-times oversampling filter are symmetrical about the central coefficient 180, only one half of the coefficients needs to be stored in the coefficient store 200. Also, rounding the coefficients to 24-bit precision for storage means that only 322345 out of the 323307 coefficients are non-zero).

In response to each of the five coefficient addresses supplied by the clock processor 30, the coefficient store 200 supplies a corresponding filter coefficient to a multiplier 210. At the same time, a sample buffer 220 storing the eight-times oversampled input samples 110 supplies an appropriate sample to the multiplier 210 to be multiplied by that filter coefficient. The products of the multiplications performed by the multiplier 210 are supplied to a summation unit 230 which adds the five products to generate an output sample. This five-stage process is repeated for each output sample to be generated by the delay adjuster filter 20.

It is not possible to use a known filter coefficient derivation algorithm such as the Remez Exchange algorithm (described in the book 'Theory and Practice of Digital Signal Processing', Rabiner and Gold, Prentice Hall, 1975) to generate the coefficients in the 65536-times oversampling filter used in the delay adjuster filter 20. This is because the computation time required to generate the coefficients would be prohibitive for such a large oversampling factor. Instead, the filter coefficients are generated as follows:

(a) First an optimum multi-band digital filter interpolator capable of oversampling by an oversampling factor of $I_1$ is designed using (for example) the Remez Exchange algorithm. This filter is called the "base filter" and denoted hereinafter by $F_1$. The base filter has two passbands (at zero frequency and at $I_1$ x the input sampling frequency) and $(I_1-1)$ stopbands centred around harmonics of the input sampling frequency. The base filter has a relatively short length $T_1$ (in many cases less than 100 coefficients), so that the process of generating the coefficients of the base filter does not take a prohibitively long computation time, and that the final number of coefficients is kept low.

(b) The coefficients of the base filter $F_1$ are then combined with those of a second filter $F_2$, the second filter $F_2$ having $T_2$ coefficients and providing an oversampling factor of $I_2$. However, before this combination takes place the coefficients of the base filter are first zero inserted, which involves the insertion of $(I_2-1)$ zero valued coefficients between each pair of adjacent coefficients of the base filter. (In fact any fixed value could be inserted in this way, but the use of zero simplifies the calculations involved in combining $F_1$ and $F_2$). If the base filter is originally of $T_1$ coefficients then after zero insertion the base filter will become a filter having $((T_1-1) \cdot I_2+1)$ coefficients.

After zero-insertion the coefficients of the base filter $F_1$ are then convolved with the coefficients of the second filter $F_2$. The length of the filter developed after convolution of the zero inserted filter with the second filter $F_2$ of length $T_2$ will be $T_1.I_2+T_2-I_2$. The resulting filter will have an oversampling factor of $I_1.I_2$. This filter is then further developed.

(c) The filter produced by combining the coefficients of $F_1$ and $F_2$ in step (b) is then zero inserted and convolved with a third oversampling filter $F_3$ which has $T_3$ taps and an oversampling factor of $I_3$. Here the zero insertion involves insertion of $I_3-1$ zero valued coefficients in between each pair of adjacent coefficients of the filter resulting from step (b). The filter produced by the convolution with $F_3$ has an oversampling factor of $I_1.I_2.I_3$ and has:

$T_1.I_2.I_3+T_2 \cdot I_3.-I_2.I_3-I_3+T_3$ coefficients.

Step (c) is in effect a repetition of step (b) using $F_3$ instead of $F_2$, although the possibility of re-using one of the filters $F_1$ or $F_2$ is not excluded. Step (c) can be repeated as required using further filters $F_4, F_5 \ldots$ having $T_4, T_5 \ldots$ coefficients and oversampling factors of $I_4, I_5 \ldots$ respectively.

Assuming that the total interpolation factor required is realised using say, 3 stages of zero insertion followed by convolution (in other words, $I_{overall}=I_1.I_2.I_3.I_4$), the length of the resulting filter is equal to:

$T_{overall}=T_1.I_2. I_3.I_4+I_3.I_4.T_2+T_3.I_4+T_4-(I_2.I_3.I_4+I_3.I_4+I_4)$ The process described above can be generalised so that a filter having an oversampling factor of $I_x$ can be zero inserted and convolved with another filter having an oversampling factor of $I_y$ to generate the coefficients for a filter having an oversampling factor of $I_x.I_y$. In this way, filters having large oversampling factors can be constructed in stages, thus saving at least some of the computation time normally required to generate their coefficients.

Figure 9A:
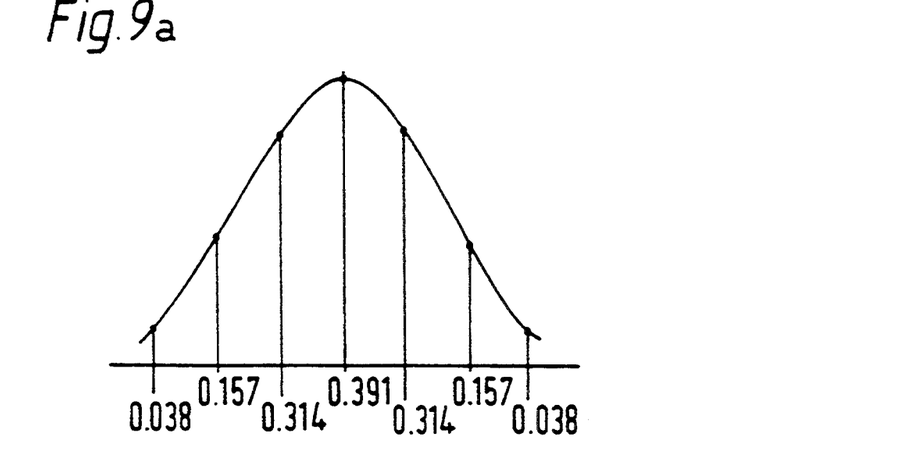
FIG. 9 illustrates the derivation of filter coefficients for an oversampling filter.
Figure 9B:
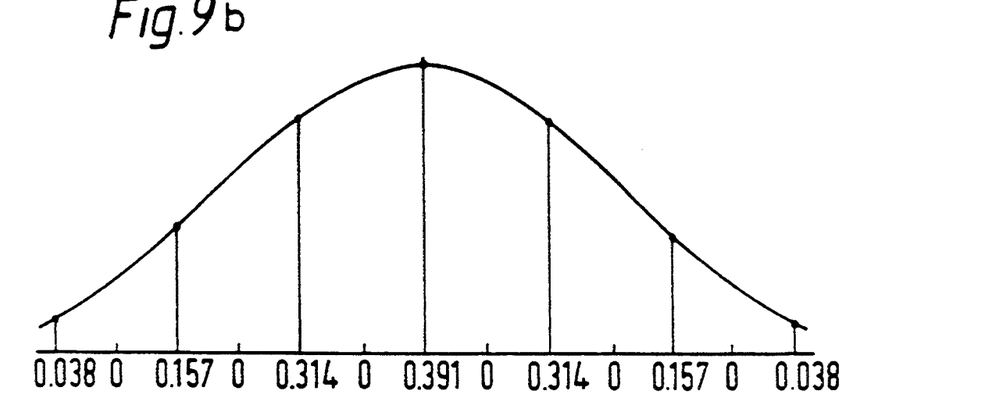
Figure 9C:
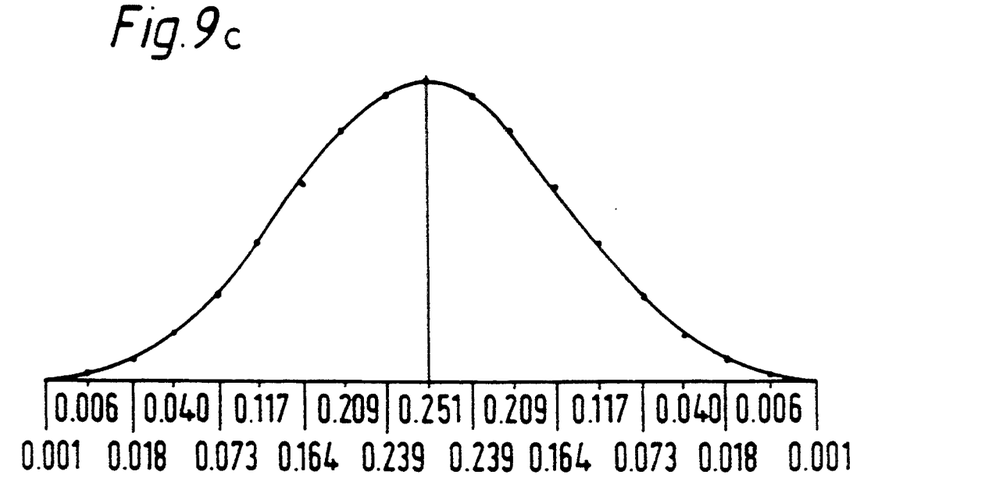

FIG. 9 is a schematic illustration of the above process in which a four-times oversampling filter (shown in FIG. 9(c)) is generated by convolving the coefficients of a two-times oversampling filter shown in FIG. 9(a) with the coefficients of a two-times oversampling filter with a zero inserted between each coefficient (shown in FIG. 9(b)). The filter shown in FIG. 9(a), and that shown in FIG. 9(b) before zero insertion, have seven coefficients, namely;

0.038; 0.157; 0.314; 0.391; 0.314; 0.157; 0.038

These coefficients are listed beneath the horizontal axis in FIGS. 9(a) and 9(b). If the coefficients in the filter in FIG. 9(a) are denoted by $g_{-3}$ to $g_3$, and those in FIG. 9(b) (i.e. after zero insertion) are denoted by $h_{-6}$ to $h_6$, the convolution process generates each coefficient $f_m$ of the output (i.e. four-times oversampling) filter shown in FIG. 9(c) as follows:

$$f_m = \sum_{i=-3}^{i=3} g_i \cdot h_{m-i}$$

The four-times oversampling filter in FIG. 9(c) is generated from a filter $F_1$ having seven coefficients and a filter $F_2$, also having seven coefficients. From step (b) above, the length of the resulting filter is $T_1.I_2.T_2+T_2-I_2=(7 \times 2)+(7-2)=19$. The resulting filter therefore has 19 coefficients, as shown in FIG. 9(c).

The simple example shown in FIG. 9 served to illustrate the filter coefficient derivation process described above. However, the process is particularly useful when filters with a large number of coefficients and/or a high oversampling factor are being generated. For example, in order to generate the coefficients of the 65536-times oversampling filter for use in the delay adjuster filter 20 of the present embodiment the following filters $F_1$ to $F_4$ are combined:

| Filter | No. of Coefficients | Oversampling Factor |
| --- | --- | --- |
| $F_1$ | $T_1 = 75$ | $I_1 = 16$ |
| $F_2$ | $T_2 = 75$ | $I_2 = 16$ |
| $F_3$ | $T_3 = 75$ | $I_3 = 16$ |
| $F_4$ | $T_4 = 75$ | $I_4 = 16$ |
| $F_{overall}$ | $T_{overall} = 323307$ | $I_{overall} = 65536$ |

The accuracy of generation of each output sample by the delay adjuster filter 20 depends on the accurate determination of the temporal position of that output sample with respect to the input samples, so that the appropriate coefficients in the 65536-times oversampling filter in the delay adjuster filter 20 can be selected. This determination of the temporal position is performed by the clock processor 30.

For an input sampling frequency ($fs_{in}$) of 48 Khz, the temporal resolution of the delay adjuster filter (that is, the temporal separation of adjacent intermediate samples 130) is about 40 ps. It is difficult to measure the temporal position of each output sample to this accuracy, because of jitter in the input and output clock frequencies and because such measurement would require an extremely fast timing circuit. However, satisfactory results can be obtained by measuring the position of each output sample to a certain accuracy (say, to the nearest 256 intermediate samples 130) and then performing a 'rolling average' of these measured values in order to generate a temporal position accurate to one intermediate sample.

Figure 10:
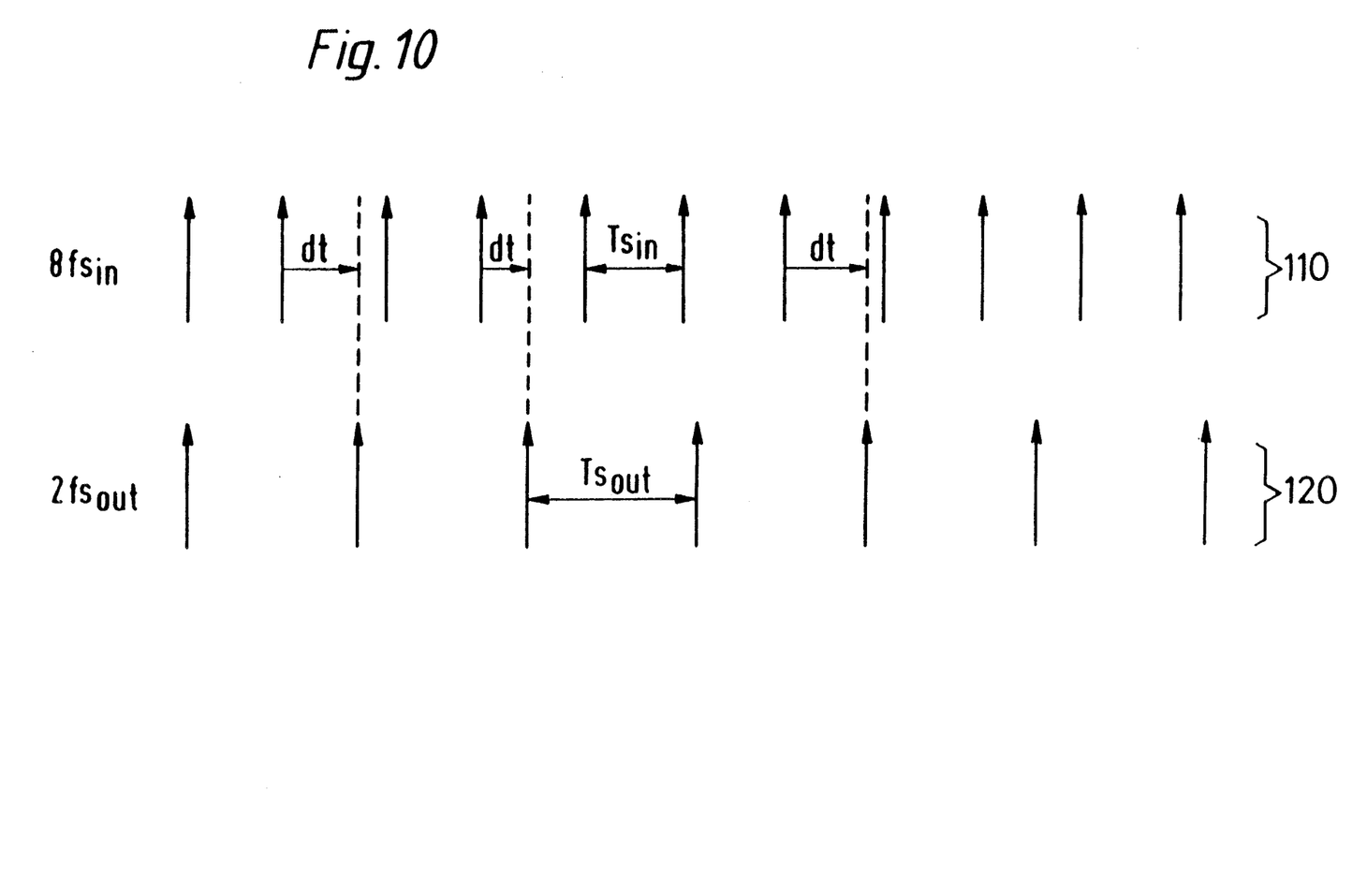
FIG. 10 illustrates the timing signals used in a clock processor.
Figure 11:
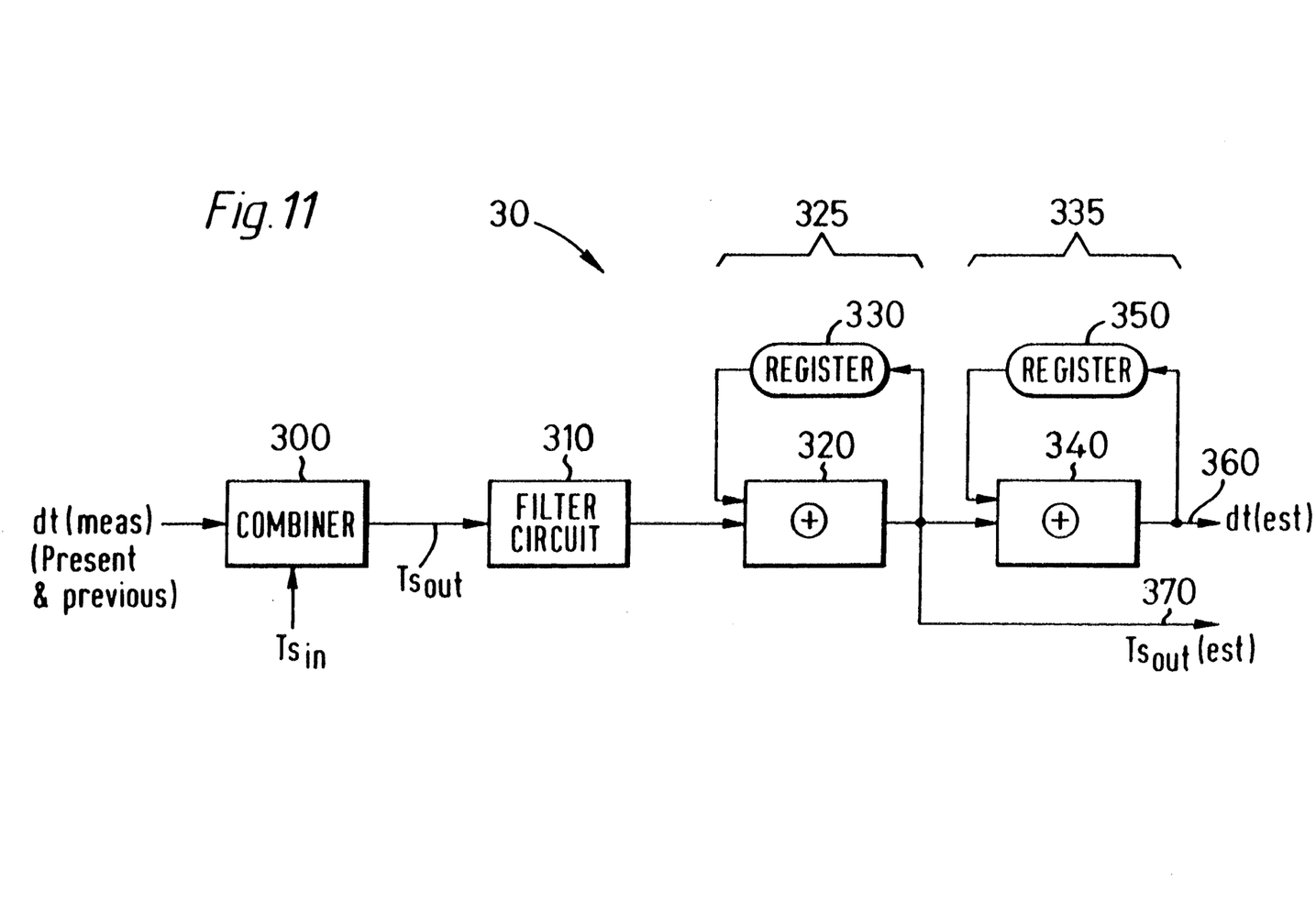
FIG. 11 is a schematic block diagram of a clock processor.

FIG. 10 is a schematic illustration showing some of the timing signals used by and generated by the clock processor 30, and FIG. 11 is a schematic block diagram of the clock processor 30.

In FIG. 10, the temporal separation of two successive eight-times oversampled output samples is referred to as $Ts_{out}$. This value is initially measured for a particular pair of eight-times oversampled input samples, (referred to as $Ts_{out}(meas)$) and then estimated ($Ts_{out}(est)$) by the clock processor to a higher precision than that of the measured value. The temporal separation of two successive eight-times oversampled input samples is referred to as $Ts_{in}$. Similarly dt is the time difference between the temporal position of each output sample and that of the immediately preceding eight-times oversampled input sample. Again, the value of dt is initially measured (dt(meas)) and then estimated (dt(est)) by the clock processor 30.

The clock processor 30 shown in FIG. 11 comprises a combiner 300, a filter circuit 310, an adder 320 and a register 330 arranged as an averager 325, and a second adder 340 and a second register 350 arranged as a second averager 335. The clock processor supplies two outputs, namely a dt(est) output 360 and a $Ts_{out}(est)$ output 370.

The combiner receives values of $Ts_{in}$ and the present and previous values of dt(meas), which are measured from the input and output clocking signals respectively. The combiner combines these values to generate values of $Ts_{out}(meas)$:

$$Ts_{out}(meas) = Ts_{in} - dt(meas)_{previous} + dt(meas)_{present}$$

The values of $Ts_{out}(meas)$ obtained in this way are smoothed by the filter circuit 310 and are then passed to the averager 325. The averager 325 serves to calculate a rolling average of the $Ts_{out}(meas)$ values, thereby generating a value of $Ts_{out}(est)$ which is supplied as the output 370.

The value of $Ts_{out}(est)$ generated by the averager 325 is also passed to the second averager 335, in which it is used to update the current value of dt(est):

$$dt(est)_{updated} = [dt(est)_{updated} + Ts_{out}(est)] \text{modulo } Ts_{in}$$

The updated value of dt(est) is supplied as the output 360.

The estimated value dt, dt(est), is used to determine the position of the centre coefficient 180 in the delay adjuster filter 20 with respect to the input samples. The positions of the remaining coefficients with respect to the centre coefficient 180 are found by simply adding multiples of 65536 to the memory address of the centre coefficient in the coefficient store 200, taking account of the fact that the filter is symmetrical and that only one half of the coefficients are stored.

The value of dt(est) computed by the clock processor is also used in the sample buffer 220 to select the appropriate 8-times oversampled input data to enter the multiplier 210.

Figure 12:
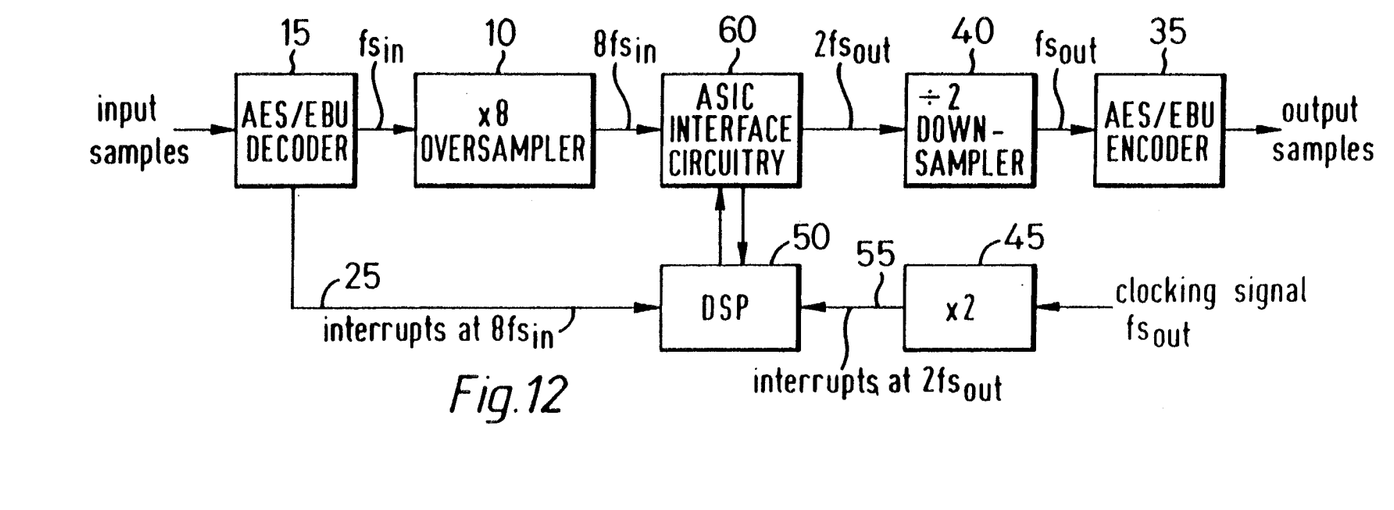
FIG. 12 is a schematic diagram showing an implementation of the digital audio sampling rate converter of FIG. 1.

FIG. 12 is a schematic diagram showing an implementation of the DASRC shown in FIG. 1, in which the functions of the delay adjuster filter 20 and the clock processor 30 are performed by a single digital signal processor (DSP) 50 such as a Motorola DSP56000 integrated circuit. The DSP 50 is linked to the eight-times oversampler 10 and the two-times downsampler 40 by an application specific integrated circuit (ASIC) or logic cell array (LCA) 60.

In the DASRC shown in FIG. 12, successive input samples are supplied in encoded form to an Audio Engineering Society/European Broadcasting Union Standard (AES/EBU) decoder 15, which supplies decoded input samples at a sampling frequency of $fs_{in}$ to the eight-times oversampler 10 and also supplies an input interrupt signal 25 to the DSP 50. The input interrupt signal 25 has a frequency of $8fs_{in}$ and is generated as part of the operation of the AES/EBU decoder 15.

After the input samples have been oversampled by the eight-times oversampler 10 they are passed to the ASIC/LCA 60 which acts as an interface for the passing of samples to and from the DSP 50. The oversampled output samples (at a sampling frequency of $2fs_{out}$) generated by the DSP 50 are passed, via the ASIC/LCA 60, to the two-times downsampler 40 in which they are converted (e.g. by filtering accompanied by the discarding of alternate samples) to output samples at a sampling frequency of $fs_{out}$. The output samples are passed to an AES/EBU encoder 35 for encoding for transmission to other apparatus (not shown).

A clocking signal at $fs_{out}$ is received by the apparatus so that the sampling frequency of the output samples can be synchronised with that used in other apparatus. The clocking signal is passed to a multiplier 45 (which may be embodied as a second AES/EBU decoder) which generates an output interrupt signal 55 having a frequency of $2fs_{out}$ from the clocking signal. The output interrupt signal 55 is passed to the DSP 50.

The input interrupt signal 25 and the output interrupt signal 55 are used to control the input of samples to the DSP 50 and the output of samples from the DSP 50 respectively. The input interrupt signal 25 is processed by the DSP 50 relatively quickly and with a higher interrupt priority than (i.e. in preference to) the output interrupt signal 55. This is achieved in the present embodiment by arranging for the input interrupt signal to use the 'short interrupt' mechanism of the Motorola DSP56000 integrated circuit referred to above. Interrupt signals processed by this mechanism are executed quickly and with high priority.

The main calculations carried out by the DSP 50 (that of the clock processor 30 and the delay adjuster filter 20) are performed using programmable on-chip registers of the Motorola DSP56000 integrated circuit. The operation of the DSP 50 is controlled by a number of programmed computation routines stored in the DSP, with each of the computation routines corresponding to one of the main functions of the DASRC such as calculation of the values $Ts_{out}(est)$ and dt(est) or the generation of coefficient addresses to be supplied to the coefficient store 200. The computation routines are initiated by the DSP 50 in response to the interrupt signals 25 and 55. In this way, the single DSP 50 controls the overall operation of the DASRC.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An apparatus for converting sampled input data having an input sampling frequency into sampled output data having a selected output sampling frequency, said apparatus comprising:
   (i) means for oversampling said input data to generate oversampled input data having a sampling frequency greater than said input sampling frequency;
   (ii) a signal processor for controlling operation of said apparatus and for generating oversampled output data from said oversampled input data, said oversampled output data having a sampling frequency greater than said output sampling frequency;
   (iii) means for generating a first control signal, at said sampling frequency of said oversampled input data, to control reading of said oversampled input data by said signal processor;
   (iv) means for generating a second control signal, at said sampling frequency of said oversampled output data, to control output of said oversampled output data by said signal processor, wherein said second control signal has a lower priority than said first control signal so that said first control signal is processed by said signal processor in preference to said second control signal; and
   (v) means for downsampling said oversampled output data to generate said output data at said output sampling frequency.

2. An apparatus according to claim 1, in which said signal processor comprises:
   an oversampler for operating on said oversampled input data to generate intermediate oversampled data; and
   means for subsampling said intermediate oversampled data to generate said oversampled output data.

3. An apparatus according to claim 2, comprising means for generating each sample in said oversampled output data from a sample in said intermediate oversampled data which is temporally closest to said each sample in said oversampled output data.

4. An apparatus according to claim 2, in which each sample in said oversampled output data is obtained by selecting said sample in said intermediate oversampled data which is temporally closest to said each sample in said oversampled output data.

5. An apparatus according to claim 1, in which said sampling frequency of said oversampled output data is lower than said sampling frequency of said oversampled input data.

6. A method of converting sampled input data having an input sampling frequency into sampled output data having a selected output sampling frequency, said method comprising the steps of:
   (i) oversampling said input data to generate oversampled input data having a sampling frequency greater than said input sampling frequency;
   (ii) generating a first control signal, at said sampling frequency of said oversampled input data, to control reading of said oversampled input data by a signal processor operable to generate oversampled output data from said oversampled input data, said oversampled output data having a sampling frequency greater than said output sampling frequency;
   (iii) generating a second control signal, at said sampling frequency of said oversampled output data, to control output of said oversampled output data by said signal processor, wherein said second control signal has a lower priority than said first control signal so that said first control signal is processed by said signal processor in preference to said second control signal; and
   (iv) downsampling said oversampled output data to generate said output data at said output sampling frequency.

7. An apparatus for converting sampled input data having an input sampling frequency into sampled output data having a selected output sampling frequency, said apparatus comprising:
   means for oversampling said input data so as to generate oversampled input data having a sampling frequency greater than said input sampling frequency;
   means for generating a first control signal having a frequency substantially equivalent to said sampling frequency of said oversampled input data;
   means for generating a second control signal having a frequency which is different from said frequency of said first control signal and which is substantially equivalent to a sampling frequency of oversampled output data;
   signal processor means for receiving said oversampled input data and for generating therefrom said oversampled output data in which said frequency of said oversampled output data is greater than said output sampling frequency and less than said sampling frequency of said oversampled input data, in which said signal processor means reads said oversampled input data from said means for oversampling in accordance with said first control signal and outputs said oversampled output data in accordance with said second control signal, said first control signal having a higher priority than said second control signal whereupon said signal processor means performs processing in accordance with said first control signal in preference to that in accordance with said second control signal; and
   means for downsampling said oversampled output data so as to generate said output data at said output sampling frequency.

8. A method of converting sampled input data having an input sampling frequency into sampled output data having a selected output sampling frequency, said method comprising the steps of:
   oversampling said input data so as to generate oversampled input data having a sampling frequency greater than said input sampling frequency;
   generating a first control signal having a frequency substantially equivalent to said sampling frequency of said oversampled input data;
   generating a second control signal having a frequency which is different from said frequency of said first control signal and which is substantially equivalent to a sampling frequency of oversampled output data;
   generating said oversampled output data from said oversampled input data by utilizing a signal processor in which said sampling frequency of said oversampled output data is greater than said output sampling frequency and less than said sampling frequency of said oversampled input data, in which said signal processor reads said oversampled input data in accordance with said first control signal and outputs said oversampled output data in accordance with said second control signal, said first control signal having a higher priority than said second control signal whereupon said signal processor performs processing in accordance with said first control signal in preference to that in accordance with said second control signal; and downsampling said oversampled output data so as to generate said output data at said output sampling frequency.

* * * * *